United States Patent
Kashiwazaki (10) Patent No.: US 10,553,525 B2
(45) Date of Patent: Feb. 4, 2020

(54) SEMICONDUCTOR DEVICE AND MANUFACTURING METHOD OF SEMICONDUCTOR DEVICE

(71) Applicant: Renesas Electronics Corporation, Kawasaki-shi (JP)

(72) Inventor: Tomoya Kashiwazaki, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 29 days.

(21) Appl. No.: 14/752,884

(22) Filed: Jun. 27, 2015

(65) Prior Publication Data
US 2015/0380342 A1 Dec. 31, 2015

(30) Foreign Application Priority Data

Jun. 30, 2014 (JP) .................................. 2014-133849

(51) Int. Cl.
*H01L 23/495* (2006.01)
*H01L 23/00* (2006.01)
*H01L 23/31* (2006.01)

(52) U.S. Cl.
CPC .... *H01L 23/49541* (2013.01); *H01L 23/3121* (2013.01); *H01L 23/4952* (2013.01);
(Continued)

(58) Field of Classification Search
CPC ......... H01L 24/85; H01L 24/49; H01L 24/06; H01L 23/49551; H01L 23/49503;
(Continued)

(56) References Cited

U.S. PATENT DOCUMENTS 5,937,279 A * 8/1999 Sawada ............... H01L 23/3142
257/E23.037
8,558,398 B1 * 10/2013 Seetharam ........ H01L 23/49503
257/784
(Continued)

FOREIGN PATENT DOCUMENTS

CN 1359539 A1 7/2002
CN 205016506 U 2/2016
(Continued)

OTHER PUBLICATIONS

Japanese Office Action dated Jul. 18, 2017 with an English translation thereof.
(Continued)

*Primary Examiner* — Lauren R Bell
(74) *Attorney, Agent, or Firm* — McGinn I.P. Law Group, PLLC.

(57) ABSTRACT

A semiconductor device has a semiconductor chip, a signal lead that is arranged in a periphery of the semiconductor chip and has a main surface and a rear surface opposed to the main surface, a wire that electrically connects the semiconductor chip and the main surface of the signal lead, and a sealing body made of sealing resin that seals the semiconductor chip, the signal lead and the wire. The signal lead has, in an extending direction of the signal lead, one end located inside the sealing body, the other end located outside the sealing body, and a wire connection region which is the main surface of the signal lead and to which the wire is connected, and an inner groove is provided in the main surface of the signal lead between the one end and the wire connection region.

4 Claims, 9 Drawing Sheets

(52) U.S. Cl.
CPC .. *H01L 23/49503* (2013.01); *H01L 23/49551* (2013.01); *H01L 24/04* (2013.01); *H01L 24/06* (2013.01); *H01L 24/32* (2013.01); *H01L 24/48* (2013.01); *H01L 24/49* (2013.01); *H01L 24/85* (2013.01); *H01L 23/3107* (2013.01); *H01L 24/73* (2013.01); *H01L 2224/04042* (2013.01); *H01L 2224/0612* (2013.01); *H01L 2224/32245* (2013.01); *H01L 2224/48247* (2013.01); *H01L 2224/49113* (2013.01); *H01L 2224/73265* (2013.01)

(58) Field of Classification Search
CPC ....... H01L 23/3107; H01L 2224/05554; H01L 2224/48465; H01L 2224/73265; H01L 2224/04042; H01L 2224/32245; H01L 2224/48247; H01L 2224/49113; H01L 2224/48091; H01L 2924/386; H01L 23/49544; H01L 23/49541–23/49555; H01L 23/49562; H01L 23/4952; H01L 24/42–49; H01L 23/28–3192
See application file for complete search history.

(56) References Cited

U.S. PATENT DOCUMENTS

| | | | |
|---|---|---|---|
| 2002/0149090 A1* | 10/2002 | Ikenaga | H01L 21/6835 257/666 |
| 2003/0001249 A1 | 1/2003 | Shimanuki | |
| 2003/0127711 A1* | 7/2003 | Kawai | H01L 21/4842 257/666 |
| 2004/0150078 A1* | 8/2004 | Minamio | H01L 23/3107 257/669 |
| 2004/0232442 A1 | 11/2004 | Shimanuki | |
| 2006/0071307 A1 | 4/2006 | Shirasaka et al. | |
| 2006/0249831 A1* | 11/2006 | Connah | H01L 23/4824 257/690 |
| 2008/0283980 A1* | 11/2008 | Gao | H01L 23/49541 257/670 |
| 2008/0296784 A1 | 12/2008 | Shimanuki | |
| 2010/0044854 A1 | 2/2010 | Shimanuki | |
| 2011/0018122 A1 | 1/2011 | Shimanuki | |
| 2011/0177657 A1* | 7/2011 | Itou | H01L 21/4828 438/123 |
| 2012/0146228 A1 | 6/2012 | Shimanuki | |
| 2013/0062613 A1* | 3/2013 | Takeshita | H01L 33/62 257/76 |
| 2014/0106509 A1 | 4/2014 | Shimanuki | |
| 2015/0228558 A1 | 8/2015 | Shimanuki | |
| 2015/0380342 A1 | 12/2015 | Kashiwazaki | |
| 2016/0276253 A1 | 9/2016 | Shimanuki | |

FOREIGN PATENT DOCUMENTS

| | | |
|---|---|---|
| JP | H 05-315512 A | 11/1993 |
| JP | H 06-140563 A | 5/1994 |
| JP | H 08-107172 A | 4/1996 |
| JP | H 10-4170 A | 1/1998 |
| JP | 2003-318348 A | 11/2003 |
| JP | 2004-328015 A | 11/2004 |
| JP | 2006-108306 A | 4/2006 |
| JP | 2010-283252 A | 12/2010 |
| JP | 2015-153987 A | 8/2015 |
| TW | 560032 B | 11/2003 |

OTHER PUBLICATIONS

Chinese Office Action dated Jan. 17, 2019 in corresponding Chinese Patent Application No. 201510289444.6, with an English translation thereof.
Chinese Office Action dated May 20, 2019, in corresponding Chinese Application No. 201510289444.6, with an English translation thereof.
Chinese Office Action dated Jun. 26, 2018, in corresponding Chinese Application No. 201510289444.6, with an English translation thereof.
Chinese Office Action dated Oct. 9, 2019, in corresponding Chinese Application No. 201510289444.6, with an English translation thereof.

* cited by examiner

SEMICONDUCTOR DEVICE AND MANUFACTURING METHOD OF SEMICONDUCTOR DEVICE

CROSS-REFERENCE TO RELATED APPLICATION

The present application claims priority from Japanese Patent Application No. 2014-133849 filed on Jun. 30, 2014, the content of which is hereby incorporated by reference into this application.

TECHNICAL FIELD OF THE INVENTION

The present invention relates to a semiconductor device and a manufacturing technique thereof, for example, a technique effectively applied to a resin-sealed type semiconductor device using a lead frame.

BACKGROUND OF THE INVENTION

Japanese Patent Application Laid-Open Publication No. H6-140563 (Patent document 1) describes that a groove or a projecting part is formed in a side surface of a die pad on which a semiconductor chip is mounted.

Also, Japanese Patent Application Laid-Open Publication No. H10-4170 (Patent document 2) describes that a discontinuous groove is formed in a chip mounting part of a lead frame on which a semiconductor chip is mounted.

Further, Japanese Patent Application Laid-Open Publication No. H8-107172 (Patent document 3) describes that concave-convex parts are formed on the surface of leads arranged in the periphery of a semiconductor chip.

SUMMARY OF THE INVENTION

A resin-sealed type semiconductor device using a lead frame has been known as a form of a package of a semiconductor device. Also, in the resin-sealed type semiconductor device, a heat cycle test has been performed in order to secure the reliability thereof.

However, in the heat cycle test, a problem of breakage of a bonding wire at a connection part between a bonding wire and a lead has occurred due to the exfoliation of sealing resin from the lead.

The other problems and novel characteristics will be apparent from the description of the present specification and the accompanying drawings.

A semiconductor device according to an embodiment includes: a semiconductor chip; a lead that is arranged in a periphery of the semiconductor chip and has a main surface and a rear surface opposed to the main surface; a wire that electrically connects the semiconductor chip and the main surface of the lead; and a sealing body made of sealing resin that seals the semiconductor chip, the lead and the wire. The lead has, in an extending direction of the lead, one end located inside the sealing body, the other end located outside the sealing body, and a wire connection part which is the main surface of the lead and to which the wire is connected, and a groove is provided in the main surface of the lead between the one end and the wire connection part.

According to the embodiment mentioned above, reliability of a semiconductor device can be enhanced.

DESCRIPTIONS OF THE PREFERRED EMBODIMENTS (Description Form, Basic Term and Usage in this Application)

In this application, the embodiment will be described in a plurality of sections or the like when required as a matter of convenience. However, these are not irrelevant to each other unless otherwise stated in particular, and the one relates to the entire or a part of the other as a modified example, details, or the like irrespective of the order of descriptions. Also, the description of the same portions is not repeated in principle. Further, the components in the embodiment are not always indispensable unless otherwise stated in particular, except the case where the components are logically indispensable and unless otherwise specified clearly from the context.

Similarly, in the description of an embodiment and others, even when "X made up of A" or the like is referred to with respect to a material and a composition, X containing elements other than A is not excluded unless otherwise stated in particular and unless otherwise specified clearly from the context. For example, when referring to an ingredient, it means "X containing A as a main ingredient" or the like. For example, even when "silicon member" or the like is referred to, it is needless to say that the meaning is not limited to pure silicon and the member includes those containing additives other than silicon such as SiGe (silicon-germanium) alloy, multi-element alloy containing silicon as a main ingredient and the like. In addition, even when a gold plating, a Cu layer, a nickel plating and others are referred to, not only a pure one but a member containing each of gold, Cu and nickel as a main ingredient is included unless otherwise specified in particular.

Further, even when a specific value or amount is referred to, a value larger than the specific value or smaller than the specific value is also applicable unless otherwise stated in particular, except the case where it is logically limited to the specific value and unless otherwise specified clearly from the context.

Also, the same or similar components are denoted by the same or similar reference sings or characters throughout the drawings for describing the embodiment, and the repetitive description thereof is omitted.

In addition, in the accompanying drawings, hatching may be omitted even in a cross section in the case where the drawings become rather complicated or distinction from a clearance is apparent. In association with this, when it is obvious from the description or the like, a contour line in a background may be omitted even in a case of a planarly closed hole. In addition, in order to specify the fact that a portion is not a clearance or specify a boundary of regions, hatching or dot pattern may be given even in the case other than the cross section.

(Embodiment)

<Description of Related Technique>

Figure 9:
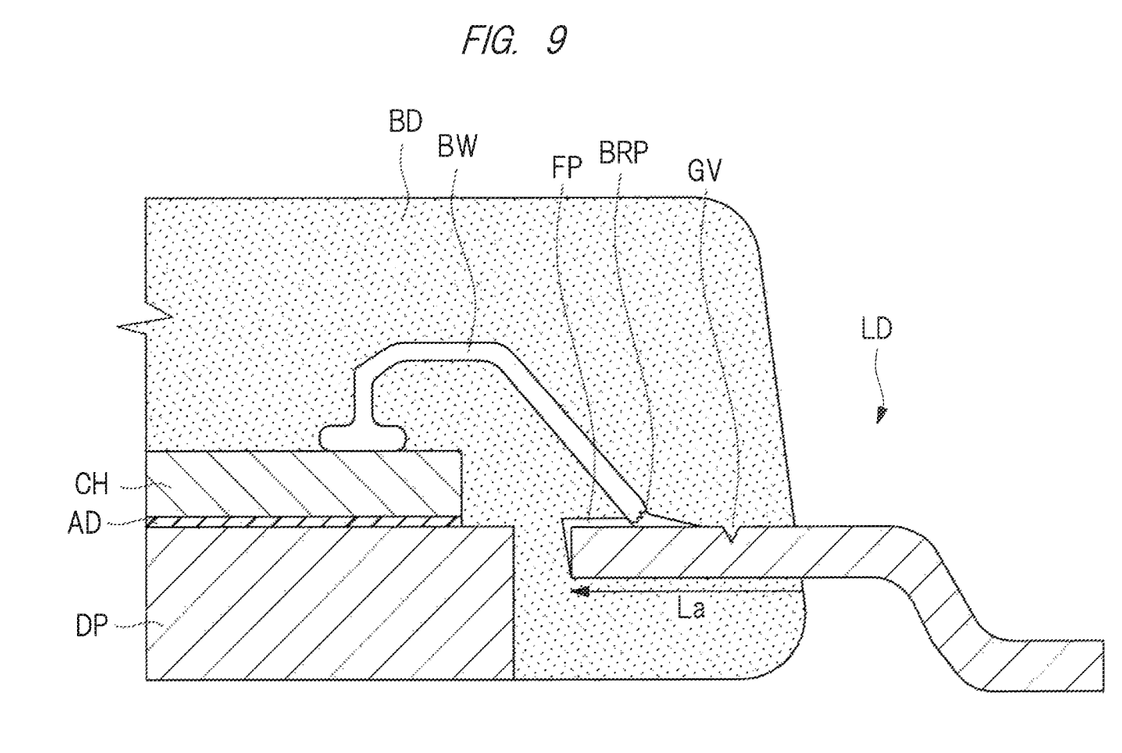
FIG. 9 is a sectional view illustrating a principal part of a configuration of a semiconductor device of a related technique studied by the inventor of the present invention.

First, a related technique studied by the inventor of the present invention will be described with reference to drawings. FIG. 9 is a sectional view illustrating a principal part of a configuration of a semiconductor device of a related technique of the present embodiment.

A semiconductor device illustrated in FIG. 9 is a resin-sealed type semiconductor device, and has a die pad DP, a semiconductor chip CH bonded on the die pad with a die bonding material AD, a lead LD electrically connected to the semiconductor chip CH by a wire BW, and a sealing body BD which seals the die pad DP, the semiconductor chip CH, the wire BW and the lead LD.

In the semiconductor device of the related technique, sealing resin which constitutes the sealing body BD is made of epoxy resin or the like and a linear expansion coefficient thereof is about 9 ppm/K, and the lead LD is made of copper (Cu) and a linear expansion coefficient thereof is about 17 ppm/K. Namely, the sealing resin and the lead LD are made of materials whose linear expansion coefficients are largely different from each other.

Also, in the semiconductor device of the related technique, the heat cycle test is carried out in an inspection process before product shipment. In the heat cycle test, for example, one cycle in which a product is exposed to the environment of a low temperature (−65° C.) and a high temperature (150° C.) respectively for 30 minutes is repeated 500 times (500 cycles), thereby evaluating the reliability and durability of the product.

According to the study by the inventor of the present invention, it has been found that, in the heat cycle test, an exfoliated portion FP is caused at an interface between the sealing resin and the lead LD which have mutually different linear expansion coefficients and a crack BRP finally occurs in the wire BW, which leads to the breakage. More specifically, it has been found that a thermal contraction amount differs between the sealing resin and the lead LD due to the difference in linear expansion coefficient between the sealing resin and the lead LD in the exfoliated portion FP and a shearing stress is applied to the wire BW due to the difference, by which the crack BRP occurs. Further, since the larger a distance La from the surface of the sealing body BD is, the larger the difference in the thermal contraction amount between the sealing resin and the lead LD becomes, the exfoliation is likely to occur at a tip (side close to the semiconductor chip CH) of an inner part of the lead LD.

It has been found that the reliability of the semiconductor device of the related technique is remarkably deteriorated due to the crack BRP or breakage caused in the wire BW. In the present embodiment, a technique to enhance the reliability of the semiconductor device is provided.

In the semiconductor device of the related technique, a groove GV is formed in an inner part of the lead LD on a side close to a side surface of the sealing body BD, but this groove GV is provided for preventing the lead LD from coming off from the sealing body BD. Since the exfoliation at the interface between the sealing resin and the lead LD is likely to occur at a tip of the inner part of the lead LD, the groove GV provided on an outer side (side close to the side surface of the sealing body BD) relative to a contact portion between the wire BW and the lead LD cannot prevent the exfoliation caused at a tip of the inner part.

Figure 1:
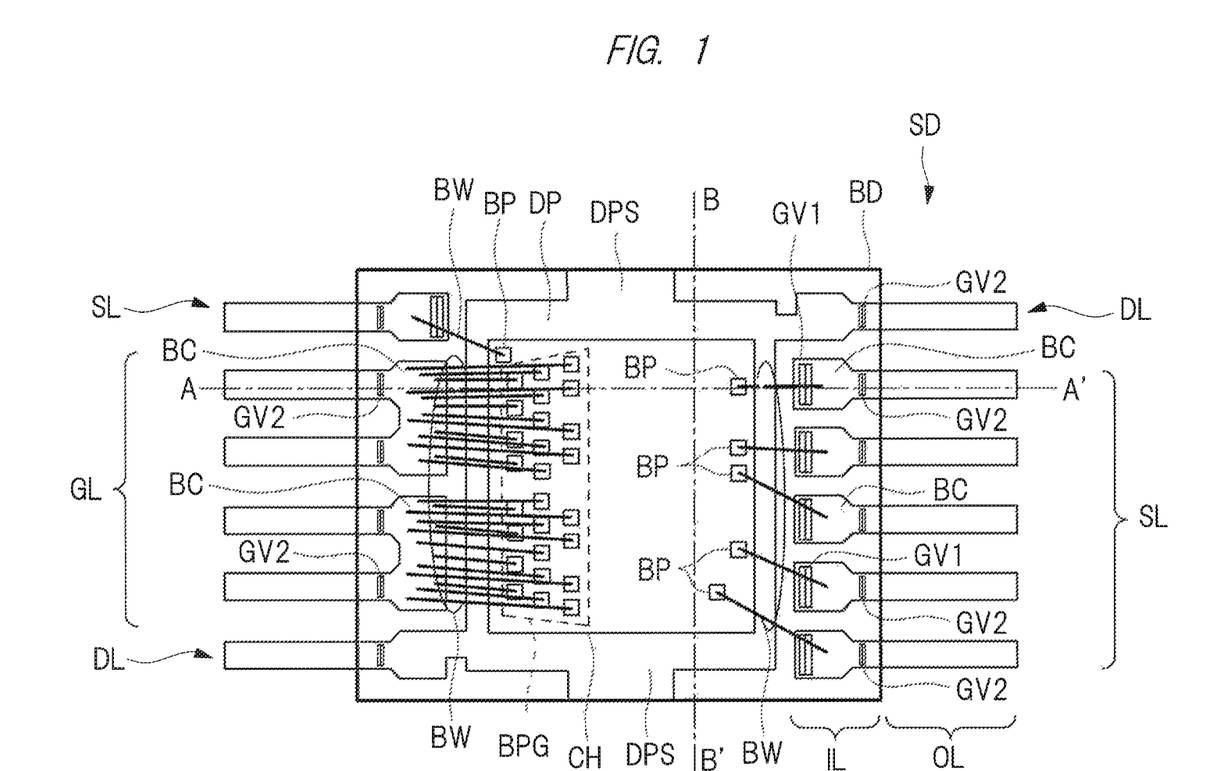
FIG. 1 is a plan view of a semiconductor device according to an embodiment.
Figure 2:
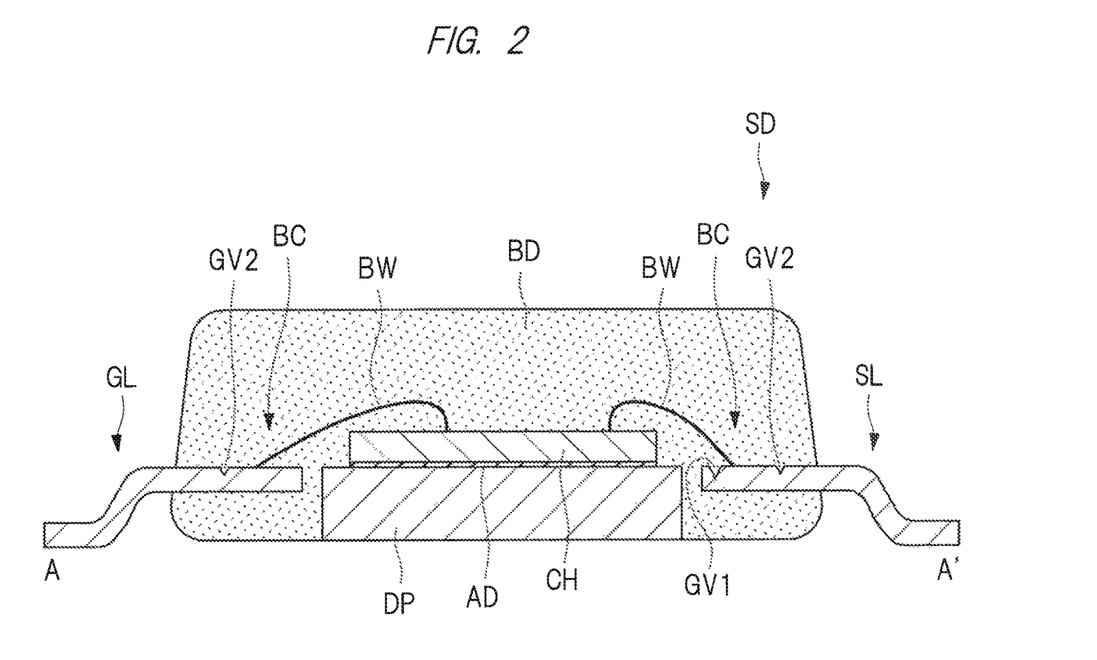
FIG. 2 is a sectional view of the semiconductor device illustrated in FIG. 1.

The technique described in the present embodiment is applicable to the resin-sealed type semiconductor device of various package types manufactured by using a lead frame. However, in the present embodiment, the case in which the technique is applied to the resin-sealed type semiconductor device of an SOP (Small Outline Package) type having a plurality of leads serving as external terminals exposed on the side surface of the sealing body will be described as an example. However, the technique is applicable also to, for example, QFP (Quad Flat Package). FIG. 1 is a plan view of the semiconductor device of the present embodiment, and FIG. 2 is a sectional view taken along a line A-A' of FIG. 1.

<Semiconductor Device>

First, a configuration of a semiconductor device SD of the present embodiment will be described with reference to FIG. 1 and FIG. 2. The semiconductor device SD of the present embodiment is provided with the die pad (chip mounting part, tab) DP and the semiconductor chip CH mounted on the die pad DP via the die bonding material (adhesive material) AD (see FIG. 2). Also, the semiconductor device SD has a plurality of leads (terminals, external terminals) arranged next to (in the periphery of) the semiconductor chip CH (die pad DP) and a plurality of wires (bonding wires, conductive members) BW which electrically connect each of a plurality of pads (electrodes, bonding pads) of the semiconductor chip CH and the plurality of leads.

The plurality of leads include a plurality of signal leads SL, a plurality of source leads GL and a plurality of dummy leads DL. Also, the plurality of pads include a plurality of signal pads BP and a plurality of source pads BPG, and the signal pad BP and the signal lead SL are electrically connected by the wire. Also, the source pad BPG and the source lead GL are electrically connected by the wire. Also, the dummy lead DL is connected to the die pad DP. Also, the semiconductor device SD is provided with the sealing body (resin body) BD which seals the semiconductor chip CH, the plurality of leads and the plurality of wires BW. Also, a plurality of suspension leads DPS are connected to the die pad DP, and extend from the die pad DP toward the outside of the sealing body BD.

As illustrated in FIG. 1, the semiconductor chip CH is made up of a silicon (Si) substrate having a quadrangular planar shape, a plurality of semiconductor elements and wirings are formed on a main surface of the silicon substrate, and a plurality of pads are formed on the semiconductor elements and wirings via an insulating film. A rear surface opposed to the main surface of the silicon substrate is bonded to the main surface of the die pad DP via the die bonding material AD. The plurality of pads are electrically connected to the semiconductor elements via wirings. The plurality of pads include the plurality of signal pads BP and the plurality of source pads BPG mentioned above. The plurality of signal pads BP are arranged along a first side of the semiconductor chip CH (silicon substrate), and the plurality of source pads BPG are arranged in multiple rows along a second side opposed to the first side of the semiconductor chip CH. In FIG. 1, all the pads in a part enclosed with a dashed line are the source pads BPG. Note that the wiring, the signal pad BP and the source pad BPG are made up of an alloy layer mainly composed of aluminum (Al), but they may be made up of an alloy layer mainly composed of copper (Cu). In addition, as the die bonding material AD, for example, an epoxy-based adhesive material or a conductive adhesive material in which metal particles made of silver (Ag) or the like are mixed with epoxy-based thermosetting resin is used.

In the periphery of the semiconductor chip CH (die pad DP), a plurality of leads are arranged. In the present embodiment, a plurality of leads extend in a direction orthogonal to the first side and the second side of the semiconductor chip CH mentioned above. Further, each of the plurality of leads has one end and the other end in an extending direction thereof, and one end is located inside the sealing body BD and the other end is located outside the sealing body BD. In other words, one end is arranged close to the first side or the second side of the semiconductor chip CH. Also, as illustrated in FIG. 1, each of the plurality of leads is made up of an inner part IL located inside the sealing body BD and an outer part OL located outside the sealing body BD. Each of the plurality of leads has the main surface, a rear surface opposed to the main surface and side surfaces which connect the main surface and the rear surface.

Each of the plurality of leads is made of a metallic material, for example, a metal mainly composed of copper (Cu), and though not illustrated, a plating treatment of a so-called lead free solder which does not substantially contain lead (Pb) is carried out on the outer part OL of the lead. The lead free solder is made of, for example, only tin (Sn), tin-bismuth (Sn—Bi) or tin-copper (Sn—Cu). A linear expansion coefficient of a plurality of leads made of copper (Cu) is about 17 ppm/K.

One ends of the plurality of signal leads SL are arranged along the first side of the semiconductor chip CH, and one ends of the plurality of source leads GL are arranged along the second side of the semiconductor chip CH. Note that one of the signal leads SL is exceptionally arranged on the side close to the second side of the semiconductor chip CH. Two dummy leads DL extend toward opposing corners of the quadrangular semiconductor chip CH and are connected to the die pad DP.

Each of the signal leads SL has the outer part OL and the inner part IL, and the inner part IL includes a wire connection region BC to which the wire BW is connected, an inner groove GV1 and an outer groove GV2. In a part of the wire connection region BC, a wire connection part in which the wire BW and the signal lead SL are connected is present. The wire connection region BC, the inner groove GV1 and the outer groove GV2 are formed on the main surface of the signal lead SL. The inner groove GV1 is formed between the wire connection part and the tip (one end) of the inner part IL, and prevents the exfoliation at the interface between the sealing resin and the signal lead SL at the tip of the inner part IL. In addition, a crack and breakage of the wire BW can be prevented by the inner groove GV1. The outer groove GV2 is formed in the inner part IL between the wire connection region BC (or wire connection part) and the other end of the signal lead SL, and has an effect of preventing the signal lead SL from coming-off. The signal pad BP and the signal lead SL are connected by one wire BW. The wire BW is made of, for example, copper (Cu). Since only one wire BW is connected to the signal lead SL and the shearing stress based on the difference in the thermal contraction amount between the sealing resin and the signal lead SL is thus applied to the one wire BW, a crack and breakage of the wire BW are likely to occur. Therefore, it is effective to provide the inner groove GV1 in the signal lead SL.

The source lead GL also has an outer part OL and an inner part IL, and the inner part IL includes the wire connection region BC to which the wire BW is connected and the outer groove GV2. In a part of the wire connection region BC, a wire connection part in which the wire BW and the signal lead SL are connected is present. The wire connection region BC and the outer groove GV2 are formed on the main surface of the source lead GL. The plurality of wires BW are connected to the wire connection region BC of the source lead GL. In addition, as illustrated in FIG. 1, the wire connection regions BC of two adjacent source leads GL are connected to each other, and the plurality of wires BW are connected also to the joint part thereof. In each of the source leads GL, the outer groove GV2 is formed in the inner IL between the wire connection region BC (or wire connection part) and the other end of the source lead GL. However, in the source lead GL, in order to secure a wide area for the wire connection region BC, the inner groove GV1 is not formed between the wire connection region BC and one end of the source lead GL. More specifically, since the inner groove GV1 is not formed in the source lead GL, a uniform flat surface is formed from the wire connection region BC to the one end of the source lead GL. In other words, a uniform flat surface is formed between the outer groove GV2 and the one end of the source lead GL. Since the plurality of wires BW are connected to each of the source leads GL and a shearing stress based on the difference in the thermal contraction amount between the sealing resin and the source lead GL is thus divided among the plurality of wires BW, the shearing stress applied to one wire BW becomes small. Therefore, a crack and breakage are less likely to occur in the plurality of wires BW connected to the source lead GL. For this reason, only the outer groove GV2 is provided in the source lead GL without providing the inner groove GV1 and the formation region of the inner groove GV1 is also used as the wire connection region BC, so that the number of wires BW connected to the source lead GL is increased, a low resistance connection between the source pad BPG and the source lead GL is realized, and stabilization of a source potential of the semiconductor chip CH is achieved.

A planar shape of the sealing body (resin body) BD illustrated in FIG. 1 is a quadrangle. Also, as illustrated in FIG. 2, the sealing body BD seals the semiconductor chip CH, the die pad DP, the lead and the wire BW, and is made of, for example, epoxy resin. The sealing resin contains spherical silica particles having different diameters as filler in large quantities in order to adjust the linear expansion coefficient thereof. For example, an average particle diameter of the filler contained in the sealing resin made of epoxy resin is about 18 μm, and a linear expansion coefficient of the sealing resin constituting the sealing body BD is about 9 ppm/K. Namely, a linear expansion coefficient of the plurality of leads is larger than a linear expansion coefficient of the sealing resin. As can be seen from FIG. 1 and FIG. 2, the sealing body BD has a main surface, a rear surface (mounting surface) opposed to this main surface and four side surfaces located between the main surface and the rear surface. Although the side surface is an inclined surface as illustrated in FIG. 2, the inclined surface is not illustrated in FIG. 1, and a contour of the main surface is illustrated as a contour of the sealing body BD. As illustrated in FIG. 1, in the semiconductor device SD of the present embodiment, a plurality of leads are arranged along each of the two sides opposed to each other in the main surface of the sealing body BD. To be precise, a plurality of leads project to the outside of the sealing body BD from the two side surfaces opposed to each other as illustrated in FIG. 2. On the first side of the main surface of the sealing body BD, the plurality of signal leads SL and the dummy lead DL are arranged, and on the second side opposed to the first side, the plurality of source leads GL, the signal lead SL and the dummy lead DL are arranged. On a third side and a fourth side between the first side and the second side opposed to each other, the suspension lead DPS integrally extending from the die pad DP is arranged, respectively.

As illustrated in FIG. 1, the die pad (chip mounting part, tab) DP has approximately quadrangular planar shape. In addition, as illustrated in FIG. 2, the rear surface of the die pad DP is exposed from the rear surface of the sealing body BD. The die pad DP and the plurality of leads are formed from a single metal plate made of copper, and a film thickness of the die pad DP is larger than a film thickness of the lead. Since the die pad DP and the lead are made to have different film thicknesses, a structure in which the rear surface of the lead is covered with the sealing body BD (sealing resin) while the rear surface of the die pad DP is exposed from the rear surface of the sealing body BD can be achieved. Also, the lead and the die pad DP are made of a metallic material whose thermal conductivity is higher than that of the sealing body BD. Since the semiconductor chip CH is mounted on the die pad DP thicker than the lead and the rear surface of the die pad DP is exposed from the rear surface of the sealing body BD in this manner, heat generated in the semiconductor chip CH can be efficiently dissipated to the mounting substrate.

As illustrated in FIG. 1 and FIG. 2, the sealing resin constituting the sealing body BD covers the main surface, the rear surface and the side surfaces of the signal lead SL in the inner part IL, and the inside of the inner groove GV1 and the outer groove GV2 formed in the main surface of the signal lead SL is filled with the sealing resin. As a result of providing the inner groove GV1 and the outer groove GV2 in the signal lead SL, a contact area between the sealing resin and the signal lead SL increases and an adhesive force increases. In addition, by providing the inner groove GV1, a shearing stress applied to the interface between the sealing resin and the main surface of the signal lead SL is reduced by an anchor effect of the inner groove GV1, and thus the exfoliation at the interface can be prevented. Therefore, since the exfoliation at the interface between the sealing resin and the signal lead SL can be prevented by providing the inner groove GV1 on the side closer to the semiconductor chip CH than the wire connection region BC in the main surface of the signal lead SL, a crack and breakage of the wire BW resulting from the exfoliation which occurs from the one end side (side close to the semiconductor chip CH) of the signal lead SL can be prevented. Therefore, the reliability of the semiconductor device can be enhanced. In addition, since the outer groove GV2 is provided between the wire connection region BC and the other end of the signal lead SL in the inner part IL of the signal lead SL and the outer groove GV2 is filled with the sealing resin, it is possible to prevent the signal lead SL from coming off.

Also, the sealing resin constituting the sealing body BD covers the main surface, the rear surface and the side surfaces of the source lead GL in the inner part IL, and the inside of the outer groove GV2 formed in the main surface of the source lead GL is filled with the sealing resin. Therefore, since the outer groove GV2 is provided between the wire connection region BC and the other end of the source lead GL in the inner part IL of the source lead GL and the outer groove GV2 is filled with the sealing resin, it is possible to prevent the source lead GL from coming off.

Figure 3:
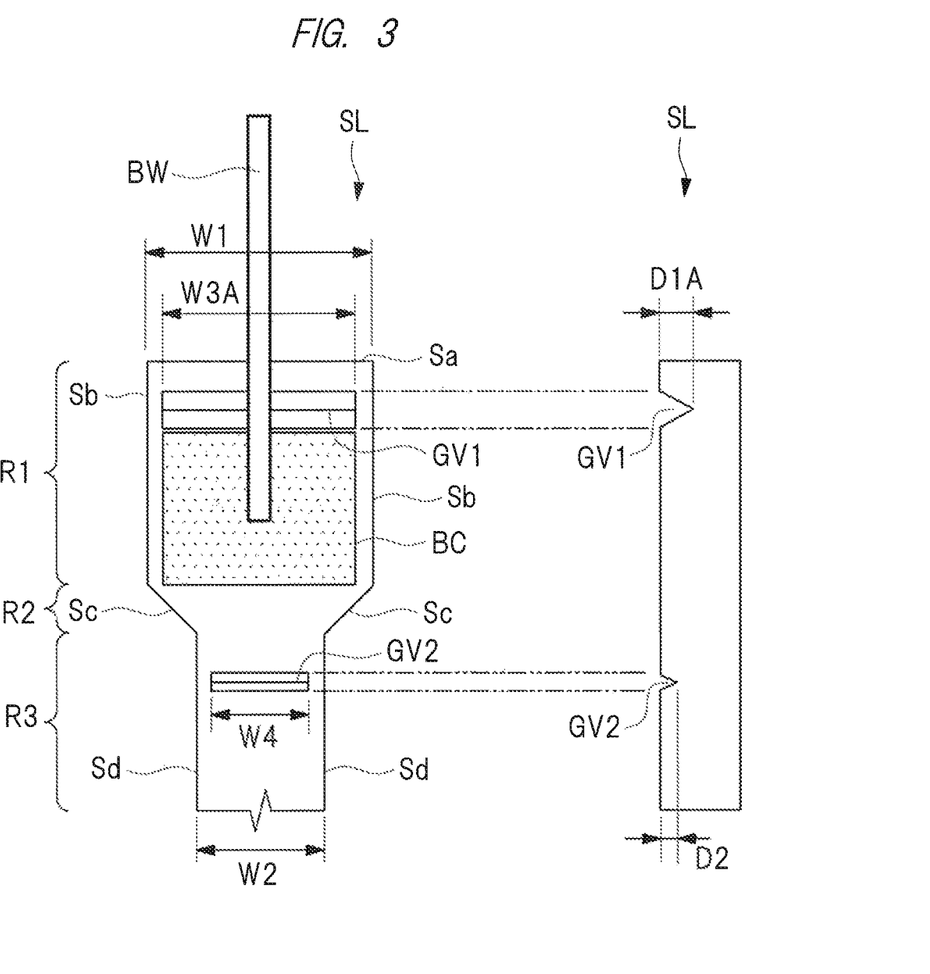
FIG. 3 is an enlarged plan view and enlarged sectional view of a signal lead of the semiconductor device according to the embodiment.

Next, a structure of the signal lead SL and an effect based on the structure will be described in detail. FIG. 3 is an enlarged plan view and enlarged sectional view of the inner part IL of the signal lead SL. As illustrated in FIG. 3, the inner part IL of the signal lead SL includes a first region R1 having a width W1, a third region R3 having a width W2 equal to that of the outer part OL illustrated in FIG. 1 and a second region between the first region and the third region. The first region R1 has a first side Sa (corresponding to the one end mentioned above) orthogonal to an extending direction of the signal lead SL and two second sides Sb along the extending direction of the signal lead SL. The third region R3 has two fourth sides Sd parallel with the extending direction of the signal lead SL, and the second region R2 has two third sides Sc, each of which connects the second side Sb of the first region R1 and the fourth side Sd of the third region R3. The width (W1) of the first region R1 is defined by the two second sides (Sb), and the width (W2) of the third region R3 is defined by the two fourth sides Sd. The width of the second region R2 gradually decreases from the first region R1 toward the third region R3.

In the first region R1, the inner groove GV1 extending in parallel with the first side Sa is formed at a position apart from the first side Sa. The region in the first region R1 between the inner groove GV1 and the second region R2 is the wire connection region BC, and the wire BW is connected to this wire connection region BC. The wire connection part in which the wire BW and the signal lead SL are connected is located in a part of the wire connection region. In the third region R3, the outer groove GV2 extends in a direction orthogonal to the extending direction of the signal lead SL (direction parallel with the first side Sa).

In order to secure a large width of the wire connection region BC of the signal lead SL, the width W1 of the first region R1 is larger than the width W2 of the third region R3 (W1>W2).

The inner groove GV1 has a V-shaped cross section, and the length thereof is W3A and the depth thereof is D1A. The inner groove GV1 is terminated inside the second sides Sb without reaching the second sides Sb. Namely, the length (W3A) of the inner groove GV1 is smaller than the width W1 of the first region R1 (W3A<W1), and both ends of the inner groove GV1 are terminated inside the second sides Sb. The outer groove GV2 has a V-shaped cross section, and the length thereof is W4 and the depth thereof is D2. Also, the length (W4) of the outer groove GV2 is smaller than the width of the third region R3 (W4<W2). The outer groove GV2 is also terminated inside the fourth sides Sd. Since the inner groove GV1 and the outer groove GV2 are terminated inside the second sides Sb and the fourth sides Sd, respectively, a mechanical strength of the signal lead SL can be maintained, and the flatness of the main surface of the signal lead SL can be secured. In addition, since a shoulder part of the inner groove GV1 is apart from the first side Sa by a prescribed distance in the extending direction of the signal lead SL, a mechanical strength of the signal lead SL can be maintained, and the flatness of the main surface of the signal lead SL can be secured. Since the flatness of the main surface of the signal lead SL can be secured, a connection reliability of the wire BW to the signal lead SL is enhanced.

The width of the wire connection region BC is equal to the width of the inner groove GV1 (W3A), and the position thereof corresponds to the inner groove GV1. More specifically, since the inner groove GV1 always exists at the position where the wire BW is connected to the signal lead SL in the extending direction of the signal lead SL, even if the connecting position of the wire BW (wire connection part) is dislocated in a direction orthogonal to the extending direction of the signal lead SL, the above-mentioned crack and breakage of the wire BW can be prevented reliably.

Also, the length of the inner groove GV1 (W3A) is equal to the width of the wire connection region BC, and is larger than the lead width (W2) of the third region R3 and the length (W4) of the outer groove GV2 (W3A>W2 and W4). Because of this structure, it is possible to secure the large width of the wire connection region BC of the signal lead SL, and even when the connection position of the wire BW is dislocated in a direction orthogonal to the extending direction of the signal lead SL, the above-mentioned crack and breakage of the wire BW can be prevented reliably.

Since the inner groove GV1 is filled with the sealing resin and the shearing stress applied to the interface between the sealing resin and the main surface of the signal lead SL is reduced by the anchor effect, the depth (D1A) of the inner groove GV1 is made larger than that of the outer groove GV2.

Since the depth (D2) of the outer groove GV2 is made smaller than that of the depth (D1A) of the inner groove GV1, a mechanical strength of the signal lead SL can be maintained, and the flatness of the wire connection region BC can be secured. In addition, since the main surface of the inner part IL of the signal lead SL has a totally uniform surface except the formation region of the inner groove GV1 and the outer groove GV2, the flatness of the wire connection region BC can be secured. As the result, a connection reliability of the wire BW is enhanced.

Although the cross section of the inner groove GV1 and the outer groove GV2 has a V-shape in the description above, the cross sectional shape is not limited to this, and a U-shape, a square shape or the like is also applicable. In addition, the inner groove GV1 may be constituted of two parallel V-shaped grooves extending adjacently in a direction orthogonal to the extending direction of the signal lead SL.

<Manufacturing Method of Semiconductor Device>

Figure 4:
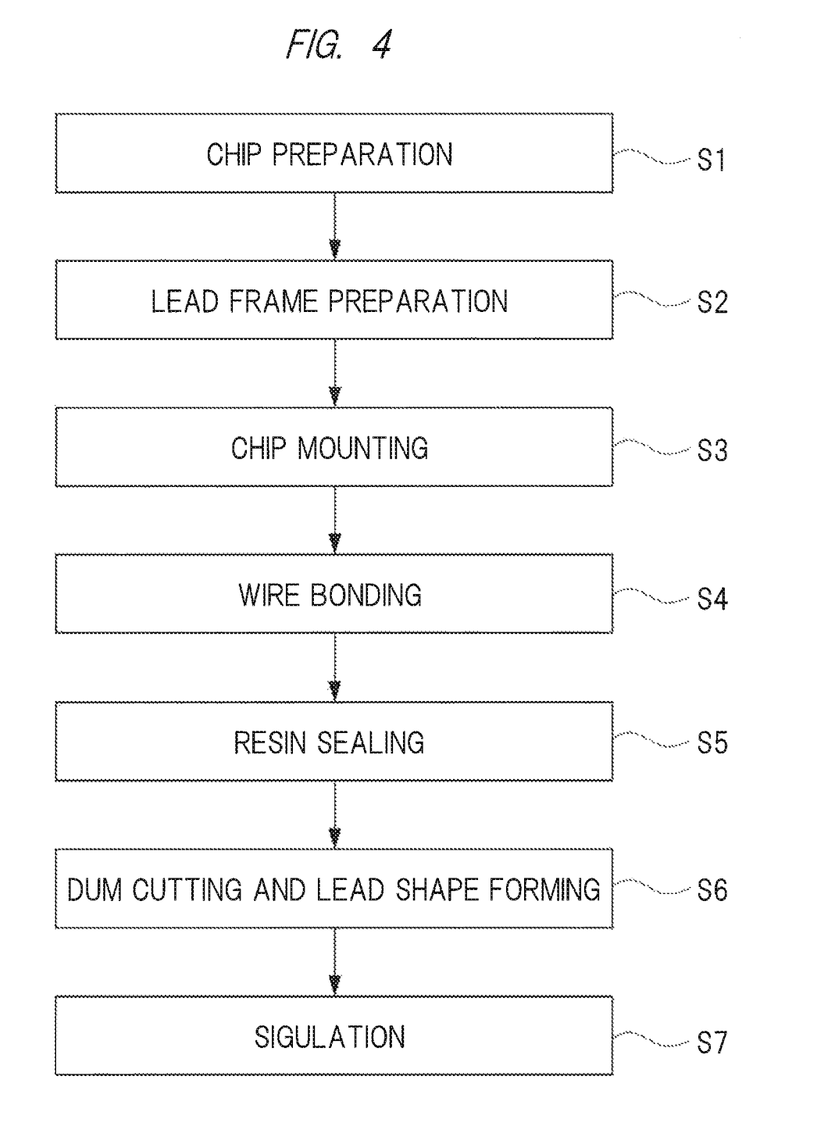
FIG. 4 is a process flow illustrating a manufacturing process of the semiconductor device according to the embodiment.

Next, a manufacturing method of the semiconductor device SD of the present embodiment will be described with reference to FIG. 1 to FIG. 6. FIG. 4 is a process flow illustrating a manufacturing process of the semiconductor device SD of the present embodiment.

First, in a chip preparation step (S1) illustrated in FIG. 4, the semiconductor chip CH is prepared. As mentioned above, the semiconductor chip CH is made up of a silicon substrate, and a plurality of semiconductor elements and wirings are formed on the main surface thereof and a plurality of pads (signal pad BP and source pad BPG) are formed on the semiconductor elements and wirings via an insulating film.

Figure 5:
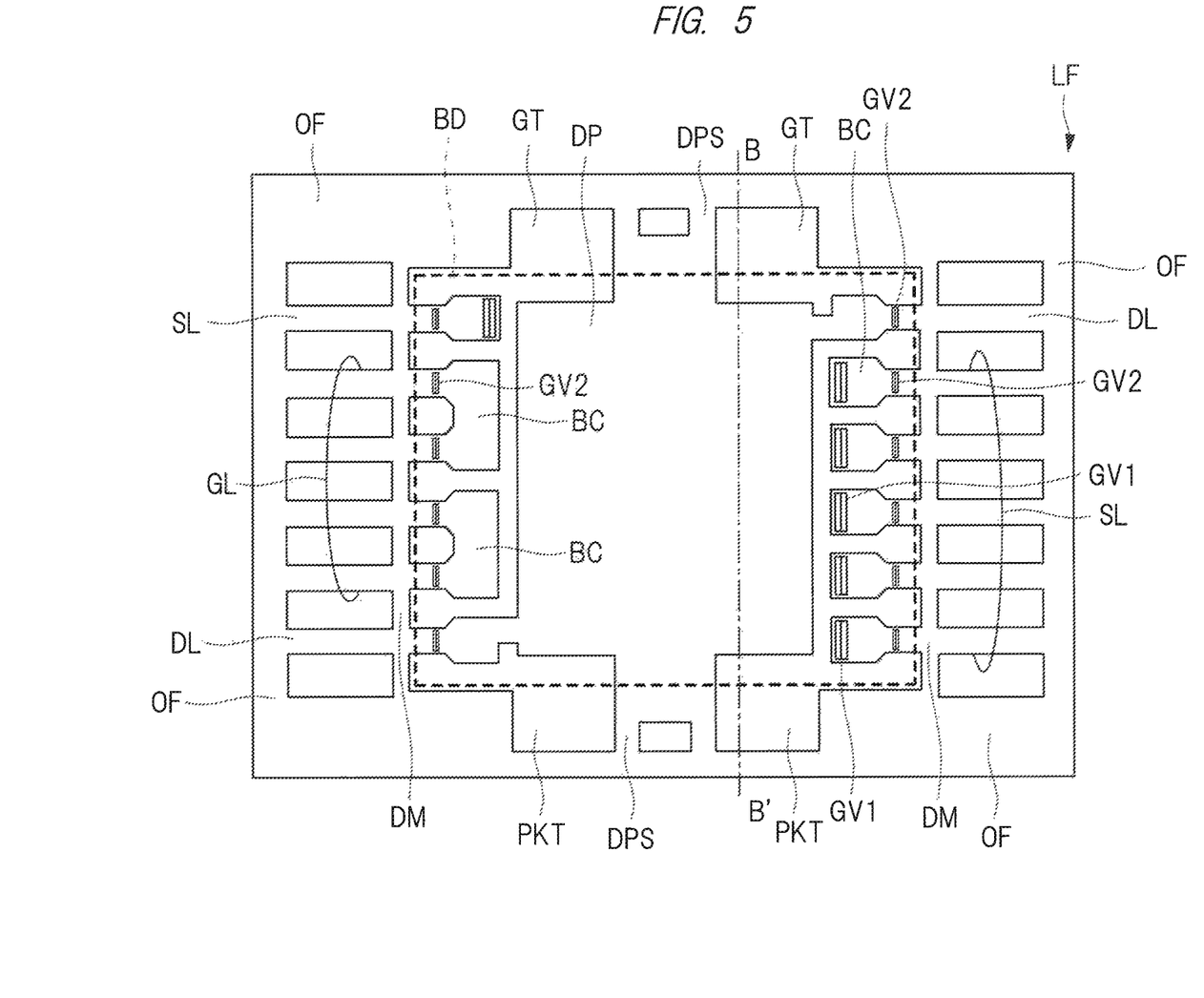
FIG. 5 is a plan view in the manufacturing process of the semiconductor device according to the embodiment.

Next, a lead frame preparation step (S2) will be described. FIG. 5 is a plan view illustrating a principal part of the lead frame LF used in the manufacturing process of the semiconductor device SD of the present embodiment. In FIG. 5, a contour of the sealing body BD is shown by a dashed line.

The lead frame LF has the die pad DP in a central part thereof, and a plurality of leads are arranged in the periphery of the die pad DP. As mentioned above, the plurality of leads include a plurality of the signal leads SL, source leads GL and dummy leads DL. Around the plurality of leads, an outer frame OF extending vertically and horizontally is arranged, and the other ends of the plurality of leads are connected to the outer frame OF. Also, a dam DM is arranged so as to connect the plurality of leads, and the dam DM is connected to the outer frame OF. The die pad DP is connected to the outer frame OF via the suspension leads DPS. In FIG. 5, on both sides of the suspension leads DPS located in an upper part, openings are formed in the lead frame LF at parts to be gates GT described later. In addition, on both sides of the suspension leads DPS located in a lower part, openings are formed in the lead frame LF at parts to be resin reservoirs PKT described later.

Next, a chip mounting step (S3) of FIG. 4 will be described. The semiconductor chip CH is bonded via the die bonding material AD on the die pad DP of the prepared lead frame LF. As the die bonding material AD, for example, an epoxy-based adhesive material or a conductive adhesive material in which metal particles made of silver (Ag) or the like are mixed with epoxy-based thermosetting resin is used.

Next, a wire bonding step (S4) will be described. As illustrated in FIG. 1 and FIG. 2, the signal pad BP of the semiconductor chip CH and the wire connection region BC of the signal lead SL are electrically connected by the wire BW. Each of the signal pads BP and each of the signal leads SL are connected by one wire BW. Further, the source pad BPG of the semiconductor chip CH and the wire connection region BC of the source lead GL are electrically connected by the wire BW. One wire BW connected to each source pad BPG is connected to the wire connection region BC of the source lead GL. To the wire connection region BC of the source lead GL, a plurality of wires BW connected to a plurality of source pads are connected. Note that FIG. 1 illustrates the state where the wire bonding step (S4) has been completed.

Figure 6:
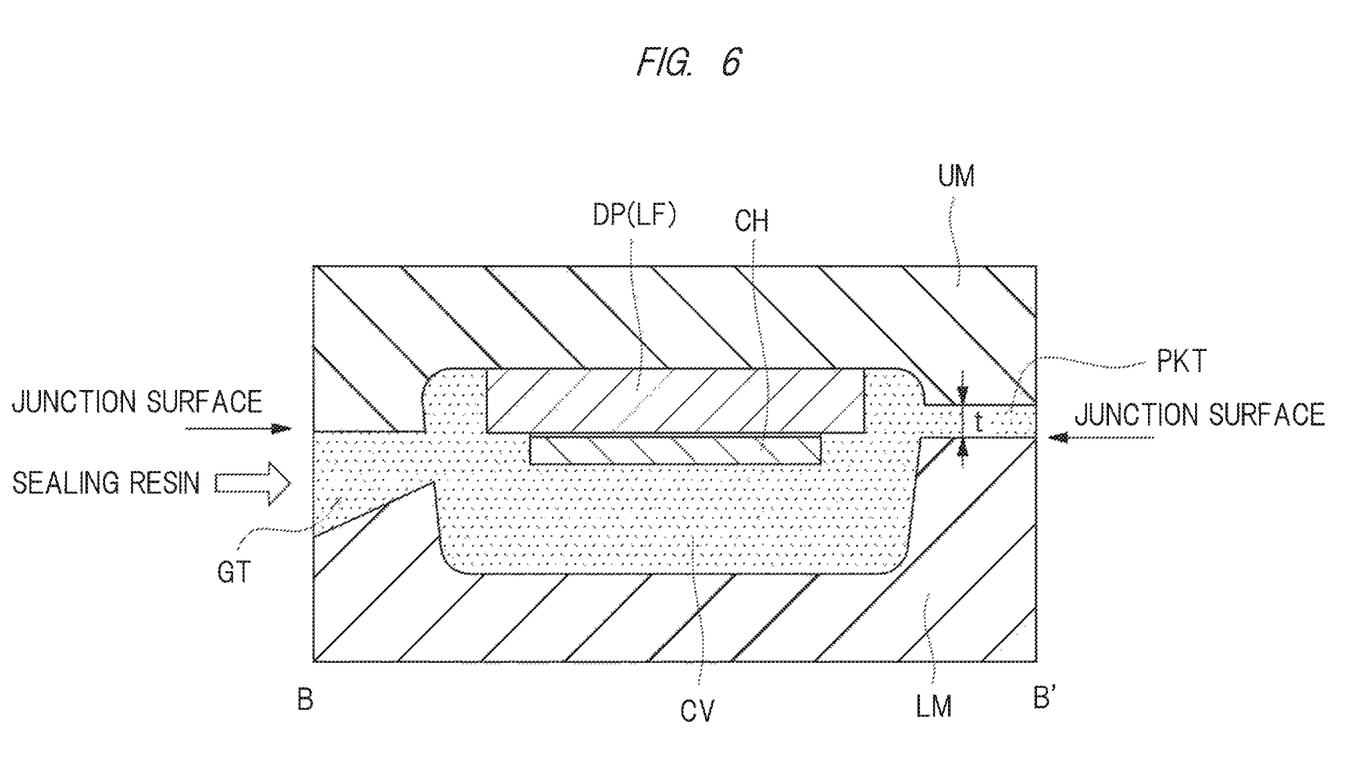
FIG. 6 is a sectional view in the manufacturing process of the semiconductor device according to the embodiment.

Next, a resin sealing step (S5) will be described. FIG. 6 is a sectional view of a resin sealing step taken along a line B-B' of FIG. 5 and FIG. 1. The lead frame LF whose wire bonding step has been completed is placed in a metal mold, and the semiconductor chip CH, the die pad DP, the plurality of leads and the wire BW are covered with sealing resin. The metal mold has a cavity CV and the gate GT and the resin reservoir PKT which communicate with the cavity CV. In the present embodiment, the gate GT and the cavity CV are formed in a lower metal mold LM, and the cavity CV and the resin reservoir PKT are formed in an upper metal mold UM. However, it is also possible to form the gate GT, the cavity CV and the resin reservoir in only one of the lower metal mold LM and the upper metal mold UM. Alternatively, it is possible to form each of them in both of the lower metal mold LM and the upper metal mold UM.

In the cavity CV provided in the lower metal mold LM and the upper metal mold UM, the semiconductor chip CH, the die pad DP and a plurality of leads are placed, and the sealing resin is injected into the cavity CV from the gate GT provided in the lower metal mold LM, thereby forming the sealing body BD (illustrated in FIG. 1 and FIG. 2) which covers the semiconductor chip CH, the die pad DP, the wire BW and the plurality of leads. The cavity CV of FIG. 6 corresponds to the inside of the sealing body BD illustrated by a dashed line in FIG. 5. As illustrated in FIG. 5 and FIG. 6, the sealing resin is injected in the cavity CV from the gate GT located on one side of the die pad DP. At this time, the resin reservoir PKT formed in the upper metal mold UM is present on the opposite side to the gate GT, and the sealing resin containing air in the cavity CV is positively poured into the resin reservoir PKT. Incidentally, a thickness (t) of the resin reservoir PKT is configured to be larger (e.g. 20 μm) than an average particle diameter (18 μm) of the filler contained in the sealing resin. When the resin reservoir PKT is not provided, air in the cavity CV is discharged to the outside of the metal mold through a very thin gap referred to as an air vent formed on the opposite side to the gate GT by an injection pressure of the sealing resin in the resin sealing step. However, since a tip end part of the sealing resin injected in the cavity CV involves air (void) in the cavity CV, the void contained amount becomes high as compared with other parts. Therefore, in the resin sealing method in which a tip end part of the sealing resin injected in the cavity CV remains in the cavity CV, the sealing body BD located on the opposite side to the gate GT will be made of the sealing resin having the high void contained amount. Since the sealing resin having the high void contained amount has low adhesion with the signal lead SL, the exfoliation is likely to occur.

According to the manufacturing method of the semiconductor device of the present embodiment, the sealing resin which has involved air is made to be poured into the resin reservoir PKT thicker than the average particle diameter (18 μm) of the filler contained in the sealing resin, and thus it becomes possible to form the sealing body BD with the sealing resin having the small void contained amount entirely. Therefore, the adhesion between the sealing resin and the signal lead SL can be enhanced, and it is possible to prevent the occurrence of the exfoliation at the interface between the sealing resin and the signal lead SL and its resulting crack and breakage of the wire BW. In particular, since the adhesion with the sealing resin is enhanced even in the signal lead SL located on the opposite side to the gate GT, the exfoliation at the interface and the crack and breakage of the wire BW mentioned above can be prevented.

Next, a dam cutting and lead formation step (S6) will be described. The lead frame LF which has completed the resin sealing step (S5) is taken out from the metal mold, and a dam DM portion which connects the plurality of leads and connects the lead and the outer frame OF is cut and removed. At this time, the suspension lead DPS is simultaneously cut along the dashed line of FIG. 5. In addition, shape forming of the outer part OL of the plurality of leads is performed, and a gull-wing shape of the outer part OL illustrated in FIG. 2 is obtained. More specifically, the plurality of leads (for example, signal lead SL and source lead GL) project from the side surface of the sealing body BD, and are bent toward the rear surface of the sealing body BD and are further bent in a direction away from the sealing body BD.

Next, a singulation step (S7) will be described. The plurality of leads which have completed the shape forming are cut from the outer frame OF of the lead frame LF, and the semiconductor device SD illustrated in FIG. 1 is completed. In addition, the plurality of leads are cut and separated from the outer frame OF by this singulation step, and the other ends of the plurality of leads are formed.

FIRST MODIFIED EXAMPLE

Figure 7:
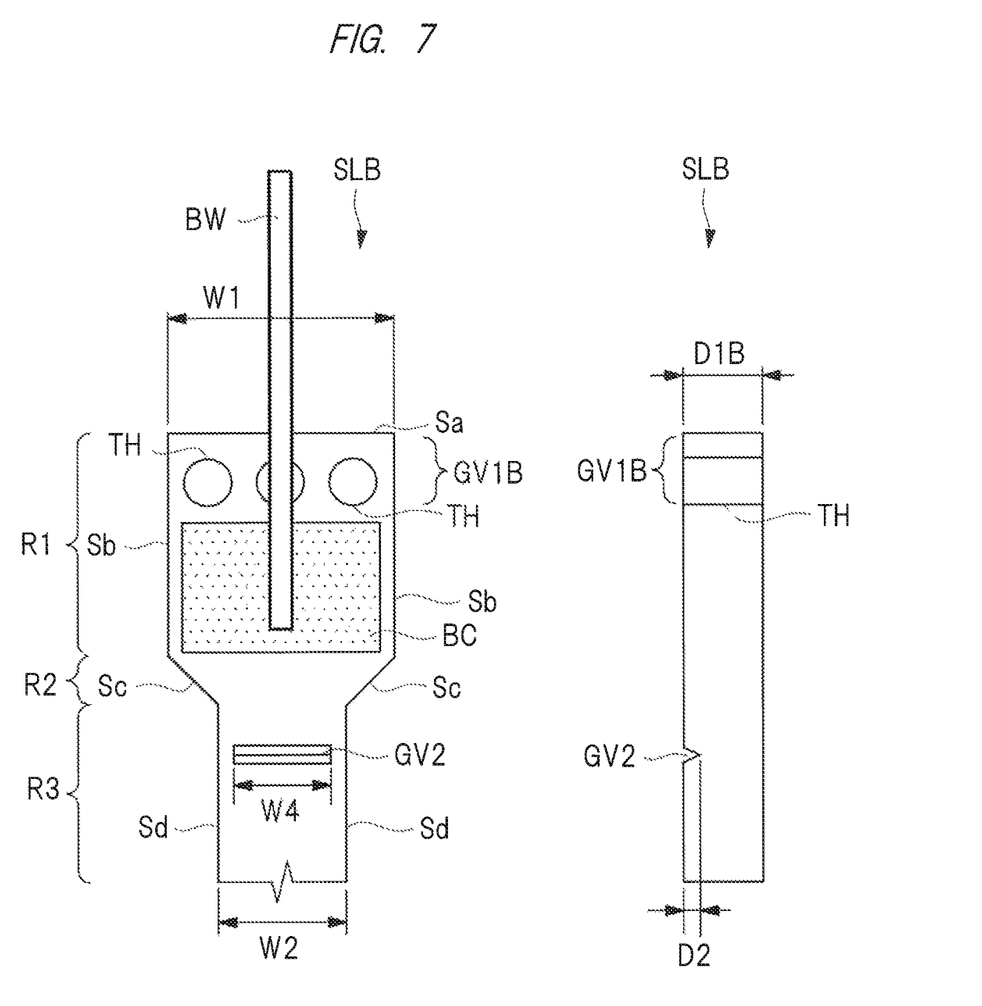
FIG. 7 is an enlarged plan view and enlarged sectional view illustrating a modified example of the signal lead with respect to FIG. 6.

FIG. 7 is an enlarged plan view and enlarged sectional view illustrating a modified example of the signal lead SL of the present embodiment. Namely, FIG. 7 corresponds to a modified example of FIG. 6.

In a signal lead SLB of the first modified example, an inner groove GV1B is made up of a plurality of through-holes TH. The plurality of through-holes TH are linearly arranged in a direction orthogonal to an extending direction of the signal lead SLB. A diameter of each through-hole TH is configured to be, for example, 5 times or more of an average particle diameter of silica filler contained in the sealing resin in order to fill the through-hole TH with the sealing resin. Specifically, the diameter is 0.1 to 0.15 mm.

Since each through-hole This formed on an inner side relative to the side Sa and the side Sb so as not to intersect with the side Sa and the side Sb, a mechanical strength of the signal lead SLB can be maintained, and the flatness of the wire connection region BC can also be maintained. In addition, since the sealing resin fills the through-hole TH, a shearing stress applied to the interface between the sealing resin and the main surface of the signal lead SLB is reduced by the anchor effect of the inner groove GV1B, and thus the exfoliation at the interface can be prevented. Therefore, the crack and breakage of the wire BW resulting from the exfoliation which occurs from one end side (side close to the semiconductor chip CH) of the signal lead SLB can be prevented, and the reliability of the semiconductor device can be enhanced.

SECOND MODIFIED EXAMPLE

Figure 8:
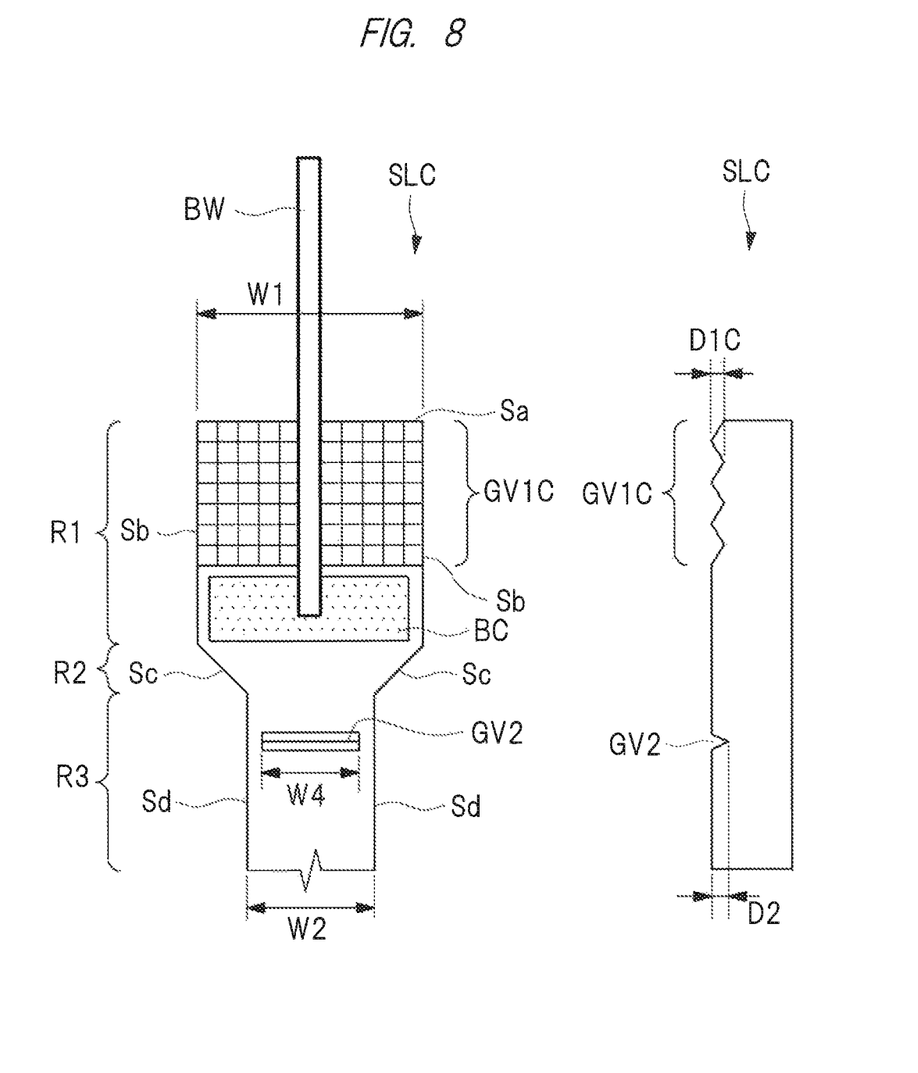
FIG. 8 is an enlarged plan view and enlarged sectional view illustrating a modified example of the signal lead with respect to FIG. 6.

FIG. 8 is an enlarged plan view and enlarged sectional view illustrating a modified example of the signal lead SL of the present embodiment. Namely, FIG. 8 corresponds to a modified example of FIG. 6.

In a signal lead SLC of the second modified example, an inner groove GV1C is made up of a plurality of shallow grooves arranged in a lattice shape. More specifically, a plurality of shallow grooves are provided adjacently in an extending direction of the signal lead SLC and in a direction orthogonal to the extending direction. A depth (D1C) of each shallow groove is smaller than a depth (D2) of the outer groove GV2.

Since the inner groove GV1C is made up of a plurality of shallow grooves arranged in a lattice shape and the sealing resin fills the shallow grooves, thereby reducing the shearing stress applied to the interface between the sealing resin and the main surface of the signal lead SLC by the anchor effect of the inner groove GV1C, the exfoliation at the interface can be prevented.

Also, since the inner groove GV1C is made up of the shallow grooves shallower than the outer groove GV2, the flatness of the wire connection region BC can be secured without reducing the mechanical strength of the signal lead SLC.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device, comprising:
a semiconductor chip;
a lead that is arranged in a periphery of the semiconductor chip and has a main surface and a rear surface opposed to the main surface;
a wire that is connected to the main surface of the lead and electrically connects the semiconductor chip and the lead; and
a sealing body in which the semiconductor chip, die lead and the wire are covered with sealing resin,
wherein the lead has, in an extending direction of the lead, one end located inside the sealing body, an other end located outside the sealing body and a wire connection part to which the wire is connected,
wherein the lead has a first groove in the main surface between the one end and the wire connection part,
wherein the first groove extends from the main surface of the lead down into the lead to a maximum depth in a first direction orthogonal to the extending direction of the lead,
wherein a first depth of the first groove at the maximum depth is less than a height of the one end of the lead in the first direction, wherein the lead has a second groove inside the sealing body that extends from the main surface of the lead down into the lead to a maximum depth in the first direction and is located in the main surface between the wire connection part and the other end, wherein a second depth of the second groove at a maximum depth of the second groove is shallower than the first depth of the first groove at the maximum depth of the first groove, and wherein a maximum first length of the first groove in a second direction is greater than a maximum second length of the second groove in the second direction, the second direction being perpendicular to the extending direction and perpendicular to the first direction.

2. The semiconductor device according to claim 1,
wherein a linear expansion coefficient of the lead is greater than a linear expansion coefficient of the sealing resin.

3. The semiconductor device according to claim 2,
wherein the lead is made of copper, and the sealing resin is made of epoxy resin containing filler made of silica.

4. The semiconductor device according to claim 1,
wherein a sectional shape of the first groove comprises a V-shape.

* * * * *